United States Patent [19]

de Moira et al.

[11] 3,930,856

[45] Jan. 6, 1976

[54] PHOTOPOLYMERISABLE COMPOSITIONS AND THEIR USES WITH DIAZONIUM SALTS AS PHOTOCATALYSTS

[75] Inventors: Peter Pinot de Moira, Old Harlow; John Philip Murphy, Witham, both of England

[73] Assignee: Ozalid Company Limited, England

[22] Filed: July 25, 1973

[21] Appl. No.: 382,330

[30] Foreign Application Priority Data

Aug. 2, 1972  United Kingdom............... 35983/72

[52] U.S. Cl. ...................... 96/33; 96/35.1; 96/36.2; 96/36.3; 96/49; 96/75; 96/91 R; 96/115 R; 96/115 P; 204/159.23; 260/2 EC; 260/47 A; 260/59 EP; 260/142

[51] Int. Cl.[2]...................... G03F 7/08; G03C 1/54

[58] Field of Search ............ 96/115 P, 115 R, 35.1, 96/91 R, 75.86 P, 33, 49, 36.2, 36.3; 260/47 A, 59 EP, 142, 2 EC; 204/159.23

[56] References Cited
UNITED STATES PATENTS

| | | | |
|---|---|---|---|
| 3,155,513 | 11/1964 | Sorensen............................ | 96/91 R |
| 3,205,157 | 9/1965 | Licari et al......................... | 96/91 R |
| 3,211,553 | 10/1965 | Ito....................................... | 96/91 R |
| 3,294,743 | 12/1966 | Mack................................... | 260/47 |
| 3,295,974 | 1/1967 | Erdmann............................. | 96/91 R |
| 3,353,984 | 11/1967 | Landau ............................... | 96/91 R |
| 3,433,769 | 3/1969 | Juneau................................ | 260/2 EC |
| 3,585,034 | 6/1971 | Levinos............................... | 96/91 R |
| 3,703,496 | 11/1972 | Hodan et al. ...................... | 260/59 EP |
| 3,708,296 | 1/1973 | Schlesinger........................ | 96/91 R |
| 3,711,390 | 1/1973 | Feinberg............................. | 96/91 R |

*Primary Examiner*—Charles L. Bowers, Jr.
*Attorney, Agent, or Firm*—Cushman, Darby & Cushman

[57] ABSTRACT

A light-sensitive material comprising a support carrying a coating of a phopolymerisable epoxy resin composition containing, as a photo-sensitive compound capable of catalyzing hardening of the epoxy resin, a diazonium salt soluble in organic solvents and whereof the cation is devoid of basic groups and the anion is selected from the following: difluorophosphate, phosphotungstate, phosphomolybdate, tungstogermanate, silicotungstate and molybdosilicate.

14 Claims, No Drawings

PHOTOPOLYMERISABLE COMPOSITIONS AND THEIR USES WITH DIAZONIUM SALTS AS PHOTOCATALYSTS

This invention relates to light-sensitive materials of the kind comprising a support carrying a coating of a sensitized resin which, when exposed to light under a master, undergoes selective hardening in the areas which have been exposed to light. Such a material, when the support is of metal or is a suitable polymeric film, can be used to produce a printing plate by image-wise exposure, followed by removal by solvent of the unhardened unexposed areas of the coating and inking up with printing ink.

A material of this nature, in which the resin is an epoxy resin and the sensitiser is a benzene diazonium fluoroborate has been described in U.S. Pat. No. 3205157. Upon exposure to ultraviolet light the diazonium compound decomposes to liberate boron trifluoride, which acts as a catalyst to harden the epoxy resin in the exposed areas of the coating.

When a printing plate is to be made the support is often of metal, e.g. anodised aluminium. While the tough nature of the hardened epoxy resin is a factor promoting a long printing run, a long run cannot bee achieved unless there is good adhesion of the hardened epoxy resin to the metal.

The object of the invention is to provide a material based on an epoxy resin which gives improved adhesion of the hardened resin to a metal support and such that little or no heating is required to harden the resin in the exposed areas of the coating.

The invention is, in part, based on a consideration which, apparently, has not hitherto been appreciated. This is that amino and other basic groups should be avoided in the diazonium salt because, if such groups are present, the Lewis acid liberated upon decomposition of the diazonium salt tends to combine with such groups and no hardening of the resin can take place without heating the material to break up the resulting compound or complex.

The invention accordingly provides a light-sensitive material comprising a support carrying a coating of a photopolymerizable epoxy resin composition containing, as a photosensitive compound capable of catalyzing hardening of the epoxy resin, a diazonium salt soluble in organic solvents and whereof the cation is devoid of basic groups and the anion is selected from the following :- difluorophosphate, phosphotungstate, phosphomolybdate, tungstogermanate, silicotungstate and molybdosilicate.

Of the above-mentioned anions difluorophosphate, phosphotungstate and phosphomolybdate ions are preferred in that order, as providing most effective bonding of the hardened resin to a metal support, probably due to the phosphate content of the diazonium salt.

Preferably the diazonium cation is selected from 2,5-dimethoxy (or diethoxy)-4-p-tolylmercaptobenzene diazonium, 2,5-diethoxy (or dimethoxy)-4-benzamidobenzene diazonium, 2,5-diethoxy (or dimethoxy)-4-n-butylmercaptobenzene diazonium and 2-N-methyl-N-ethoxycarbonylamino-4-p-tolylmercapto-5-methoxybenzene diazonium. The preferred diazonium salt is 2,5-dimethoxy-4-p-tolylmercaptobenzene diazonium difluorophosphate.

The diazonium salts containing these preferred cations have a high light-sensitivity and are sufficiently stable to have a reasonably long shelf life.

The coating will normally contain 2–15%, and preferably 8–10% of diazonium salt based on the weight of epoxy resin. Part of the latter may conveniently be an epoxylated novolak, produced by reaction of phenol formaldehyde with condensate epichlorhydrin, such as the material supplied as DEN 438 by Dow Chemical Company. This is a viscous liquid and should be used in admixture with another epoxy resin to provide a non-sticky coating.

The polymerized epoxy resin obtained on hardening is oleophilic and the material according to the invention is therefore well suited for the production of printing plates; e.g. offset lithographic plates or letterpress plates. By using as the support a metal foil bonded to an electrically non-conducting backing the material can be adapted for the production of photoresists for printed circuits. It can also be used for screen printing by using a screen as the backing.

The material may be used for the production of copies of an original by heating after exposure to render the unexposed and unhardened portions of the coating sticky and dusting on a pigment which adheres preferentially to these layers.

Suitable epoxy resins are Epikote 1001, 1004, 1007 and 1009 supplied by Shell Chemicals U.K.Ltd. and Araldite supplied by CIBA and also Epichlor supplied by the Dainippon Ink and Chemical Co.

These resins are soluble in a range of solvents including ketones, esters and glycol esters, either alone or in combination with diluents such as aromatic hydrocarbons and chlorinated hydrocarbons.

Polymerisation of the resin by the decomposition products of the complex diazonium salt is initiated by a short exposure to ultra violet light. After exposure polymerisation continues and in some cases may require up to 24 hours for completion. In such cases heat treatment for a short period at moderate temperatures considerably enhances the rate of polymerisation.

The photopolymerisable compositions may be cast, coated or extruded onto a support. Suitable supports include metals such as steel, copper, zinc or aluminium sheets or foils, plates and sheets of various film forming synthetic resins and polymers, paper and glass.

In the following Examples, exposure was in all cases to a 450 watt ultra-violet lamp at a distance of 24 inches.

EXAMPLE 1

An aluminium support which had been roughened by brushing was thinly coated with the following composition:

| | |
|---|---|
| 2,5-dimethoxy-4-p-tolylmercaptobenzene diazonium phosphotungstate | 2.0 gm. |
| Epikote 1007 supplied by Shell Chemicals U.K.Ltd. | 20.0 gms. |
| Methyl cyclohexanone | 200.0 ml. |

The coating was dried for two minutes at 100°C. The coated surface was then exposed to ultra-violet light for two minutes. The plate was then placed in an oven for a further 2 minutes at a temperature of 80°C to increase the rate of curing.

The plate was then washed with methyl ethyl ketone to remove the parts of the coating which had not been exposed to ultra-violet light. A printing plate was obtained which yielded long runs.

EXAMPLE 2

A sheet of polyester sold under the Registered Trade Mark "Melinex" was pretreated as described in U.S. Pat. No. 1,061,784 and then coated with the following composition.

| | |
|---|---|
| 2-(N-methyl-N-ethoxycarbonylamino)-4-p-tolylmercapto-5-methoxybenzene diazonium phosphotungstate | 0.8 gms. |
| Epoxy resin D.E.R. 662 supplied by Dow Chemical Company | 9.0 gms. |
| Methyl ether of ethylene glycol acetate | 90.0 ml. |

The film was dried for two minutes at 100°C and exposed for four minutes to ultra-violet light through a master. The film was then put in an oven at 80°C for two minutes. The film was developed by washing with the methyl ether of ethylene glycol acetate. A good relief image was obtained.

EXAMPLE 3

A 325 mesh silk screen was coated on both sides with the following coating composition:

| | |
|---|---|
| 2,5 diethoxy-4-p-tolylmercaptobenzene diazonium difluorophosphate | 1.0 gm. |
| Methyl Isobutyl Ketone | 40.0 ml. |
| Methyl ether of ethylene glycol acetate | 60.0 ml. |
| Epichlor 1010 obtainable from the Dainippon Ink Chemical Co. | 7.0 gms. |

The excess was removed from both sides of the screen and the coatings were then dried in an oven at 100°C. The screen was then exposed under a master to ultra-violet light then heated at 80°C for 2 minutes and the non-exposed portions of the coating were removed by washing with methyl cyclohexanone.

EXAMPLE 4

A copper foil laminated to an epoxy resin fibre glass board was cleaned and then coated with the following composition.

| | |
|---|---|
| 2,5 diethoxy-4-benzamidobenzene diazonium phosphotungstate | 1.5 gm. |
| Epikote 1004 supplied by Shell Chemicals U.K. Limited | 16.0 gms. |
| Methyl ether of ethylene glycol acetate | 150.0 ml. |

The copper coated foil was then dried and exposed through a master to ultra-violet light then heated at 80°C for 2 minutes. The areas not exposed to light were removed by washing with methyl ethyl ketone. The exposed parts of the copper foil were then removed by etching with ferric chloride solution. The plate was then washed with distilled water and dried. The cured epoxy resin remaining on the unetched portions of the plate was removed by rubbing with a cloth moistened with pyridine.

EXAMPLE 5

A sheet of polyester sold under the Registered Trade Mark Melinex as described in U.S. Pat. No. 1,061,784 and spray coated with the following composition to give a dry coating thickness of 0.050 inch.

| | |
|---|---|
| 2,5 diethoxy-4-benzamidobenzene diazonium phosphotungstate | 2.0 gm. |
| Methyl ethyl ketone | 200.0 ml. |
| Epikote 1009 supplied by Shell Chemicals U.K.Ltd. | 20.0 gms. |

After drying and exposing to ultra-violet light beneath a master the coated sheet was cured in an oven for 3 minutes at 80°C.

The non image areas were removed by washing with methyl ether of ethylene glycol acetate. After drying a plate suitable for letterpress printing was obtained.

EXAMPLE 6

Epikote 1001 is a solid melting at approximately 70°C. A sample was melted and 2,5 dimethoxy-4-p-tolylmercaptobenzene diazonium difluorophosphate was dissolved in the melt which was then coated onto a sheet of polyester film sold under the Registered Trade Mark Melinex to give a thickness of 0.050 inch. The coating was cooled and allowed to solidify. The coating was exposed to ultra-violet light under a master, heated for 4 minutes at 80°C and then developed by washing in methyl ethyl ketone.

A plate, suitable for letterpress printing was obtained.

EXAMPLE 7

A sheet of polyester film was thinly coated with the following solution:

| | |
|---|---|
| 2,5 dimethoxy-4-p-tolylmercaptobenzene diazonium tungstogermanate | 0.5 gms. |
| Epikote 1001 supplied by Shell Chemicals U.K. Limited | 10.0 gms. |
| Methyl ethyl ketone | 50.0 ml. |

The coating was dried and then exposed through a master to ultra-violet light for 2 minutes. The coating was then heated to a temperature above 80°C for 2 minutes. The areas not exposed to light became sticky and were made visible by dusting with a black pigment.

EXAMPLE 8

An anodised aluminium support was thinly coated with the following composition:

| | |
|---|---|
| Epikote 1004 (Shell Chemicals) | 30 gm. |
| D.E.N. 438 (Dow Chem. Co.) | 10 gm. |
| 2,5-dimethoxy-4-p-tolylmercaptobenzene diazonium difluophosphate | 4 gm. |
| Pentoxone (4-methoxy-4-methyl pentan-2-one.) (Shell Chemicals) | 200 ml. |

The coating was dried for 2 minutes at 80°C and left to cool. The coated surface was then exposed under a negative master to ultra-violet light for four minutes. The plate was immediately developed by swabbing with a solvent mixture containing methyl ether of ethylene glycol acetate/isopropyl alcohol/phosphoric acid (45:45:10) to remove those parts of the coating not exposed to ultra-violet light. A printing plate was obtained which inked up well and gave good definition with no scumming.

EXAMPLE 9

An anodised aluminium support was thinly coated with the following composition:

| | |
|---|---|
| Epikote 1004 (Shell Chemicals) | 20 gm. |
| 2,5-dimethoxy-4-p-tolylmercaptobenzene diazonium phosphotungstate | 2 gm. |
| Methyl ethyl ketone | 100 ml. |

The coating was dried for two minutes at 80°C and left to cool. The coated surface was then exposed under a master to ultra-violet light for 2 minutes. The plate was placed in an oven at a temperature of 80°C for a further 1 minute to increase the rate and degree of curing. The plate was developed by swabbing with the solvent developer as in Example 8 to remove the unpolymerised areas. A printing plate was obtained which inked up well and gave good definition with no scumming.

EXAMPLE 10

A sheet of Melinex treated as described in U.S. Pat. No. 1061784 was coated with the following composition:

| | |
|---|---|
| Epikote 1009 (Shell Chemicals) | 10 gm. |
| D.E.N. 438 (Dow Chem. Co.) | 30 gm. |
| 2,5-diethoxy-4-benzamido benzene diazonium difluophosphate | 2 gm. |
| Methyl ethyl ketone | 200 ml. |

The film was dried and exposed for 2 minutes to ultra-violet light through a negative master. The film was developed by washing in a bath of methyl ethyl ketone. A positive polymeric relief image was obtained.

EXAMPLE 11

A sheet of Melinex as described in U.S. Pat. No. 1061784 was coated with the following solution:

| | |
|---|---|
| Epikote 1001 (Shell Chemicals) | 20 gm. |
| 2-(N-methyl-N-ethoxycarbonylamino)4-p-tolylymercapto-5-methoxy benzene diazonium phosphomolybdate | 2 gm. |
| Methyl ethyl ketone | 100 ml. |

The coating was dried and exposed through a master to ultra-violet light for 2 minutes. The coating was then heated at 100°C for 2 minutes. The areas exposed to light were polymerised. The areas not exposed to light became sticky due to the unpolymerised Epikote 1001 melting and were made visible by dusting with a black pigment.

We claim:

1. A light-sensitive material comprising a support carrying a coating of a photopolymerisable epoxy resin composition and containing, as a photosensitive compound capable of catalyzing hardening of the epoxy resin, a diazonium salt soluble in organic solvents wherein the anion of said diazonium salt is difluorophosphate, said diazonium salt being free of amino groups and groups which would react with Lewis acids which are produced as a result of the decomposition of the diazonium salt.

2. A light-sensitive material comprising a support carrying a coating of a photopolymerisable epoxy resin composition containing, as a photosensitive compound capable of catalyzing hardening of the epoxy resin, a diazonium salt soluble in organic solvents wherein the anion of said diazonium salt is phosphotungstate, said diazonium salt being free of amino groups and groups which would react with Lewis acids which are produced as a result of the decomposition of the diazonium salt.

3. A material as claimed in claim 1, wherein the diazonium cation is selected from 2,5-dimethoxy (or diethoxy)-4-p-tolylmercaptobenzene diazonium, 2,5-diethoxy (or dimethoxy)-4-p-tolylmercaptobenzene diazonium, 2,5-diethoxy (or dimethoxy)-4-benzamidobenzene diazonium, 2,5-diethoxy (or dimethoxy)-4-n-butylmercaptobenzene diazonium and 2-N-methyl-N-ethoxycarbonylamino-4-p-tolylmercapto-5-methoxybenzene diazonium.

4. A material as claimed in claim 2 wherein the diazonium cation is selected from 2,5-dimethoxy (or diethoxy)-4-p-tolylmercaptobenzene diazonium, 2,5-diethoxy (or dimethoxy)-4-benzamidobenzene diazonium, 2,5-diethoxy (or dimethoxy)-4-n-butylmercaptobenzene diazonium and 2-N-methyl-N-ethoxycarbonylamino-4-p-tolylmercapto-5-methoxybenzene diazonium.

5. A material as claimed in claim 1, wherein the diazonium salt is present in the coating in an amount of 2–15% by weight of the weight of epoxy resin.

6. A material as claimed in claim 1, wherein the diazonium salt is present in the coating in an amount of 8–10% by weight of the weight of the resin.

7. A material as claimed in claim 1, wherein the diazonium salt is 2,5-dimethoxy-4-p-tolylmercaptobenzene diazonium difluorophosphate.

8. A material as claimed in claim 1, wherein part of the epoxy resin is an epoxylated novolak.

9. A material as claimed in claim 1, wherein the support is of aluminium.

10. A material as claimed in claim 1, wherein the support is a polymeric film.

11. A material as claimed in claim 1, wherein the support is a silk screen.

12. A method of making a printing plate, which comprises exposing to ultra-violet light under a master a material as claimed in claim 1 and developing the exposed material by removing the coating from the unexposed areas of the support by means of a solvent.

13. A method of making a printed circuit, which comprises exposing to ultra-violet light under a master a material as claimed in claim 1 wherein the support is a metal foil mounted on an electrically insulating backing, removing the unexposed areas of the coating from the support by treating with solvent and removing by etching the bared areas of the metal foil.

14. A photographic copying method, which comprises exposing to light under a master a material as claimed in claim 1, heating the exposed material to render the unexposed areas of the coating sticky and dusting pigment on to the material to effect adherence of the powder to the sticky areas.

* * * * *